United States Patent
Takano (10) Patent No.: US 10,135,326 B2
(45) Date of Patent: Nov. 20, 2018

(54) POWER CONVERSION DEVICE AND POWER SUPPLY DEVICE IN WHICH SAME IS USED

(71) Applicant: Panasonic Intellectual Property Management Co., Ltd., Osaka (JP)

(72) Inventor: Yoh Takano, Fukushima (JP)

(73) Assignee: PANASONIC INTELLECTUAL PROPERTY MANAGEMENT CO., LTD., Osaka (JP)

(*) Notice: Subject to any disclaimer, the term of this patent is extended or adjusted under 35 U.S.C. 154(b) by 0 days.

(21) Appl. No.: 15/751,199

(22) PCT Filed: Sep. 20, 2016

(86) PCT No.: PCT/JP2016/004274
§ 371 (c)(1),
(2) Date: Feb. 8, 2018

(87) PCT Pub. No.: WO2017/056450
PCT Pub. Date: Apr. 6, 2017

(65) Prior Publication Data
US 2018/0226876 A1 Aug. 9, 2018

(30) Foreign Application Priority Data
Sep. 29, 2015 (JP) ................................ 2015-191472

(51) Int. Cl.
*G05F 1/56* (2006.01)
*H02M 1/08* (2006.01)
(Continued)

(52) U.S. Cl.
CPC ........... *H02M 1/08* (2013.01); *H02M 3/1584* (2013.01); *H03K 17/6871* (2013.01)

(58) Field of Classification Search
CPC .............................. H02M 3/1584; G05F 1/56
(Continued)

(56) References Cited

U.S. PATENT DOCUMENTS 6,097,161 A * 8/2000 Takano ................. H02M 3/073
307/110
9,673,812 B2 * 6/2017 Takano ................. H03K 17/687
(Continued)

FOREIGN PATENT DOCUMENTS

JP 2012-074829 4/2012

OTHER PUBLICATIONS

International Search Report of PCT application No. PCT/JP2016/004274 dated Nov. 22, 2016.

*Primary Examiner* — Adolf Berhane
*Assistant Examiner* — Nusrat Quddus
(74) *Attorney, Agent, or Firm* — McDermott Will & Emery LLP (57) ABSTRACT

A power conversion device includes a switching element, a gate drive unit, a switch circuit unit, a DC power supply unit, and a control unit. The control unit controls a plurality of switch circuit units and a plurality of gate drive units. During a normal period, the control unit causes a first switch and a second switch to be closed, and causes a signal from the gate drive unit to continue a high level or a low level. Furthermore, during a switching period, the control unit causes the first switch and the second switch to open, and switches a signal from the gate drive unit from a low level to a high level or from a high level to a low level.

7 Claims, 6 Drawing Sheets

(51) Int. Cl.
*H02M 3/158* (2006.01)
*H03K 17/687* (2006.01)

(58) Field of Classification Search
USPC .......................................... 323/272–289, 315
See application file for complete search history.

(56) References Cited

U.S. PATENT DOCUMENTS

2012/0075890 A1   3/2012  Ozawa
2015/0137871 A1*  5/2015  Takano ................ H03K 17/687
                                                    327/389

* cited by examiner

POWER CONVERSION DEVICE AND POWER SUPPLY DEVICE IN WHICH SAME IS USED

This application is a U.S. national stage application of the PCT International Application No. PCT/JP2016/004274 filed on Sep. 20, 2016, which claims the benefit of foreign priority of Japanese patent application 2015-191472 filed on Sep. 29, 2015, the contents all of which are incorporated herein by reference.

TECHNICAL FIELD

The present disclosure relates to a power conversion device used in various apparatuses, and a power supply device using the power conversion device.

BACKGROUND ART

Figure 4:
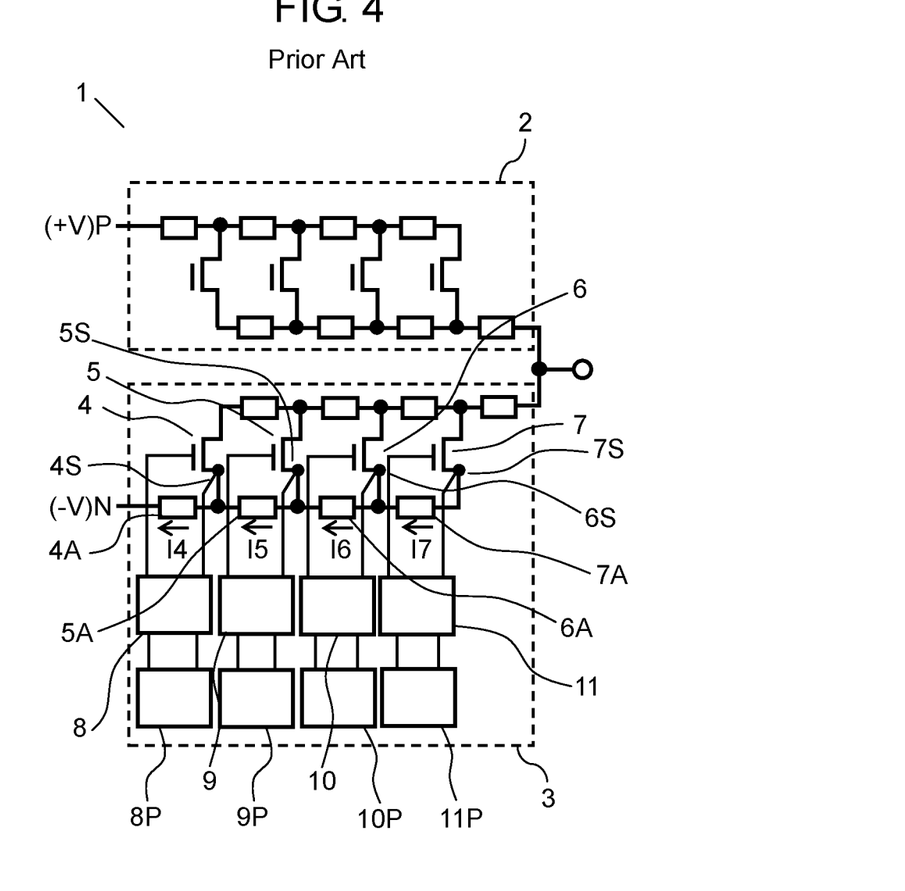
FIG. 4 is a circuit block diagram of a conventional power supply device.

Hereinafter, a conventional power conversion device is described with reference to drawings. FIG. 4 is a circuit block diagram of a conventional power conversion device. FIG. 4 is a circuit block diagram showing configurations of power conversion devices 2 and 3 in conventional power supply device 1. Power supply device 1 includes power conversion device 2 and power conversion device 3. Power conversion device 2 and power conversion device 3 have the same configuration except for polarity. Therefore, herein, the configuration and operation are described with respect to power conversion device 3.

Power conversion device 3 includes switch units 4, 5, 6, and 7, gate drive units 8, 9, 10, and 11 corresponding to switch units 4, 5, 6, and 7, and DC power supplies 8P, 9P, 10P, and 11P for supplying the gate drive units with a DC voltage. In particular, when power conversion device 3 is applied to respond to high power, in order to reduce a burden in individual switch units 4, 5, 6, and 7, and in order to respond to a large electric current, switch units 4, 5, 6, and 7 are connected in parallel.

Herein, switch units 4, 5, 6, and 7 are provided with inductive reactance 4A, 5A, 6A, and 7A, respectively. Furthermore, values of voltages generated by transient-state electric currents 14, 15, 16, and 17 flowing into inductive reactance 4A, 5A, 6A, and 7A are different from each other. Thus, values of electric potential of source terminals 4S, 5S, 6S, and 7S of switch units 4, 5, 6, and 7 are also different from each other. Gate drive units 8, 9, 10, and 11 and DC power supplies 8P, 9P, 10P, and 11P are provided corresponding to switch units 4, 5, 6, and 7, respectively. Therefore, a voltage between a gate and a source in each of switch units 4, 5, 6, and 7 is dependent on only a voltage supplied from each of gate drive units 8, 9, 10, and 11. Electric potential values of source terminals 4S, 5S, 6S, and 7S are different by the transient-state electric currents 14, 15, 16, and 17, but the voltage between the gate and the source is hardly affected by source terminals 4S, 5S, 6S, and 7S. Thus, switch units 4, 5, 6, and 7 are driven by individual gate drive units 8, 9, 10, and 11, respectively.

Note here that prior art literatures relating to this application include, for example, PTL 1.

CITATION LIST

Patent Literature

PTL 1: Japanese Patent Application Unexamined Publication No. 2012-74829

SUMMARY OF THE INVENTION

A power conversion device of the present disclosure includes a switching element, a gate drive unit, a switch circuit unit, a DC power supply unit, and a control unit.

The switching element includes a gate terminal, a drain terminal, and a source terminal. The switching element is one of a plurality of switching elements connected in parallel.

The gate drive unit includes a driver circuit, a first drive input portion, a second drive input portion, and a capacitor.

The driver circuit includes a first drive output portion, a second drive output portion, a first input terminal, and a second input terminal. The first drive output portion is connected to the gate terminal. The second drive output portion is connected to the source terminal.

The first drive input portion is connected to the first input terminal. The second drive input portion is connected to the second input terminal. The capacitor is installed between the first drive input portion and the second drive input portion. The gate drive unit is provided corresponding to the switching element, and is one of a plurality of gate drive units.

The switch circuit unit includes a first switch and a second switch. The first switch is connected to the first drive input portion. The second switch is connected to the second drive input portion. The switch circuit unit is provided corresponding to the gate drive unit, and is one of a plurality of switch circuit units.

The DC power supply unit is connected to the plurality of switch circuit units.

The control unit is connected to the plurality of switch circuit units and the plurality of gate drive units. The control unit controls opening/closing of the plurality of switch circuit units, and controls the plurality of gate drive units such that the switching elements are turned on or off.

During a normal period, the control unit causes the first switch and the second switch to be closed, and a signal from the gate drive unit to continue a high level or a low level.

During a switching period, the control unit causes the first switch and the second switch to be opened, and switches a signal from the gate drive unit from a low level to a high level or from a high level to a low level.

Furthermore, the power supply device of the present disclosure includes two of the above-mentioned power conversion devices. Polarities of electric power supplied to the two power conversion devices are different from each other.

DESCRIPTION OF EMBODIMENTS

Power conversion device 3 of power supply device 1 shown in FIG. 4 needs a plurality of DC power supplies 8P, 9P, 10P, and 11P, thus making it difficult to reduce the size or cost of power conversion device 3.

Figure 5:
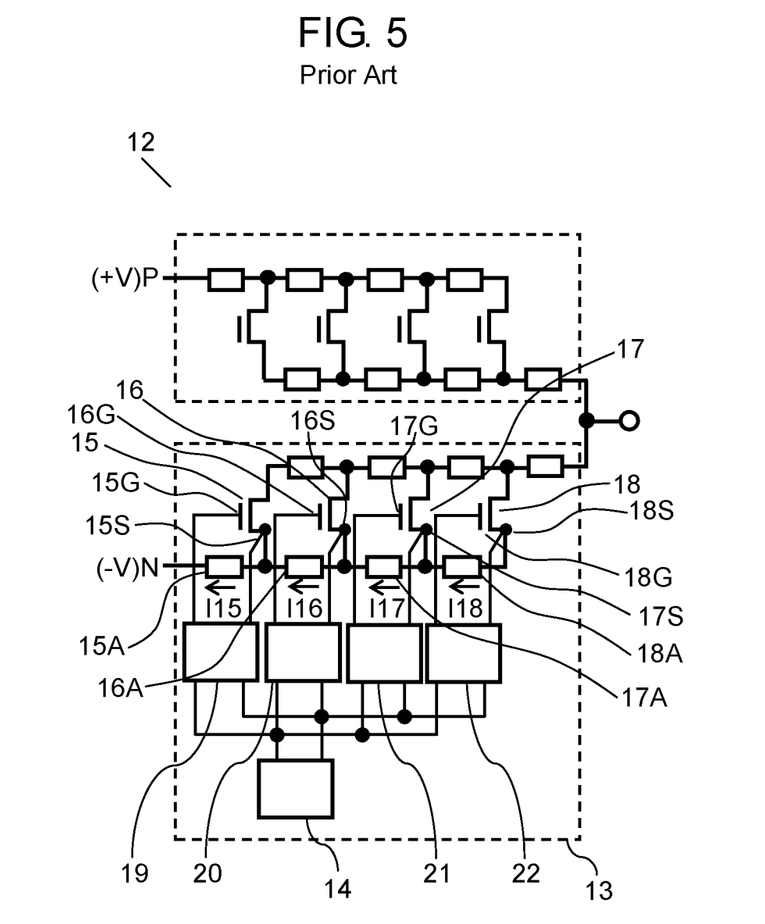
FIG. 5 is a circuit block diagram of a second conventional power supply device.

FIG. 5 is a circuit block diagram of a second conventional power supply device 12. As shown in FIG. 5, power conversion device 13 is supplied with electric power by DC power supply 14. DC power supply 14 collectively supplies electric power to gate drive units 19, 20, 21, and 22 for respectively driving switch units 15, 16, 17, and 18. This makes it possible to reduce the size and cost of power conversion device 13.

Even when a single DC power supply 14 is used, switch units 15, 16, 17, and 18 are provided with inductive reactance 15A, 16A, 17A, and 18A, respectively. Furthermore, electric currents 115, 116, 117, and 118 flowing in inductive reactance 15A, 16A, 17A, and 18A have different values. Accordingly, electric potential values of source terminals 15S, 16S, 17S, and 18S of switch units 15, 16, 17, and 18 are also different from each other. A common DC power supply 14 is provided to gate drive units 19, 20, 21, and 22 for respectively driving switch units 15, 16, 17, and 18.

Gate terminals 15G, 16G, 17G, and 18G of switch units 15, 16, 17, and 18 have the same potential values and are stable. On the other hand, source terminals 15S, 16S, 17S, and 18S have different electric potential, respectively. Furthermore, adjacent two of source terminals 15S, 16S, 17S, and 18S are connected to each other. Therefore, electric potential of source terminals 15S, 16S, 17S, and 18S may have effects on each other and may become unstable. As a result, this makes it difficult to equally hold a voltage between a gate and a source in individual switch units 15, 16, 17, and 18. In particular, at the time of switching of switch units 15, 16, 17, and 18, instability due to the effect of inductive reactance 15A, 16A, 17A, and 18A is increased by a transient-state electric current. As a result, switch units 15, 16, 17, and 18 connected in parallel do not equally operate, which may make an output unstable.

Figure 6:
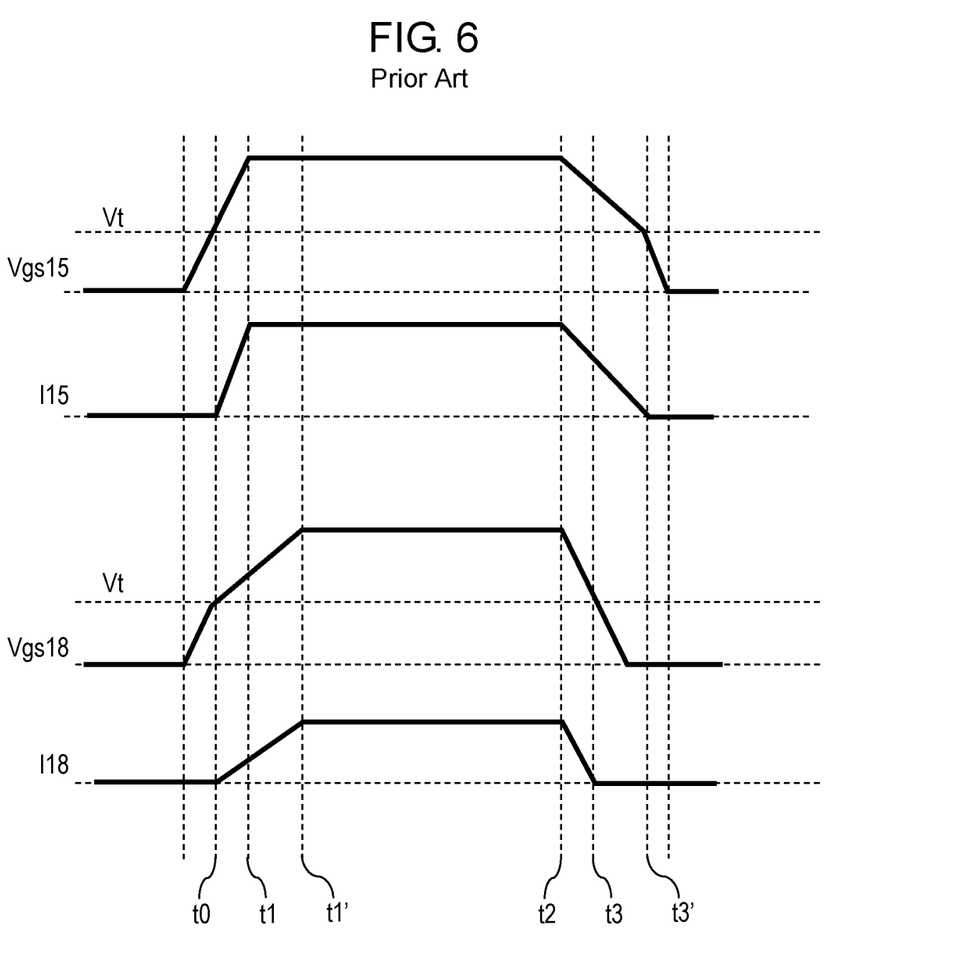
FIG. 6 is a timing chart showing an operation of the second conventional power supply device.

FIG. 6 is a timing chart showing an operation of power conversion device 13 of conventional power supply device 12. When DC power supply 14 is used in common, as shown in the timing chart of FIG. 6, voltage Vgs15 between a gate and a source of switch unit 15 and voltage Vgs18 between a gate and a source of switch unit 18 show different trajectories due to the effect of inductive reactance 15A, 16A, 17A, and 18A. That is, voltage Vgs15 and voltage Vgs18 have different values by voltages generated in inductive reactance 15A, 16A, 17A, and 18A in a transient state.

Furthermore, waveforms of FIG. 6 are shown in simplified trajectories. Actually, however, since source terminals 15S and 18S of switch units 15 and 18 are connected, trajectories are more complicated as compared with the waveforms shown in FIG. 6. In FIG. 6, a period during which voltage Vgs15 is not less than threshold Vt and a period during which voltage Vgs18 is not less than threshold Vt are different from each other.

The period during which voltage Vgs15 is not less than threshold Vt includes a period from t0 to t1, and a period from t1 to t3' during which switch unit 15 continues to be ON. The period during which voltage Vgs18 is not less than threshold Vt includes a period from t0 to t1' and a period from t1' to t3 during which switch unit 18 continues to be ON. During the period from t0 to t1', voltage Vgs15 is larger than voltage Vgs18 by an electromotive force generated in inductive reactance 16A, 17A, and 18A. Furthermore, also during the period from t2 to t3', voltage Vgs15 is larger than voltage Vgs18.

That is, waveforms of switch unit 15 and switch unit 18 may show different trajectories. An output of second power conversion device 13 may not be stable.

As mentioned above, as shown in FIG. 4, it is difficult to reduce the size and cost in power conversion device 3 having DC power supplies 8P, 9P, 10P, and 11P corresponding to switch units 4, 5, 6, and 7 and gate drive units 8, 9, 10, and 11. On the other hand, as shown in FIG. 5, power conversion device 13 having a single DC power supply 14 corresponding to switch units 15, 16, 17, and 18, the size and cost can be reduced, but an output thereof becomes unstable. Thus, it has been difficult to achieve a power conversion device having both reduction in the size and cost, and stability of output.

Hereinafter, an exemplary embodiment of the present disclosure is described with reference to drawings.

Exemplary Embodiment

Figure 1:
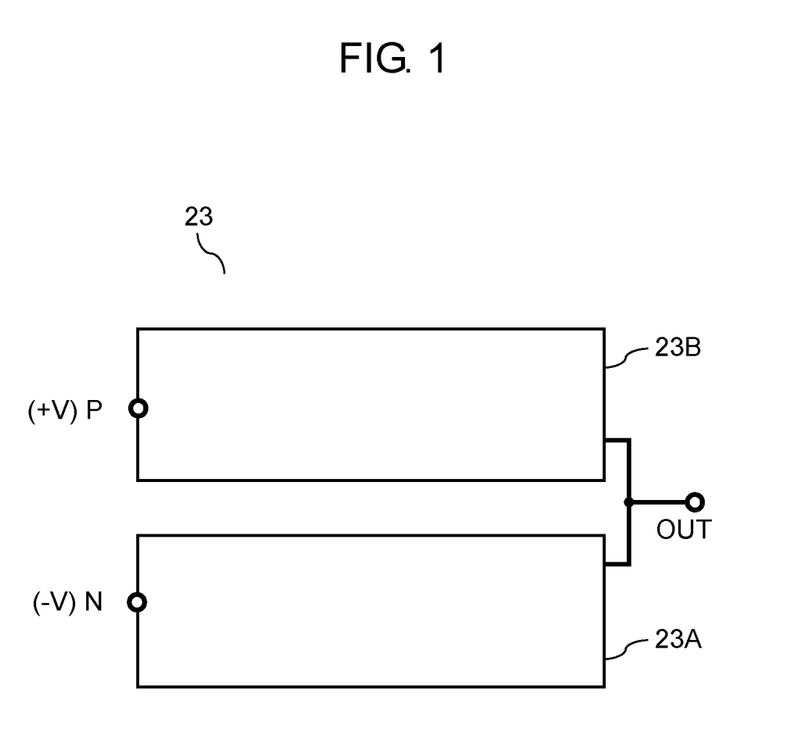
FIG. 1 is a circuit block diagram of a power supply device using a power conversion device in accordance with an exemplary embodiment.
Figure 2:
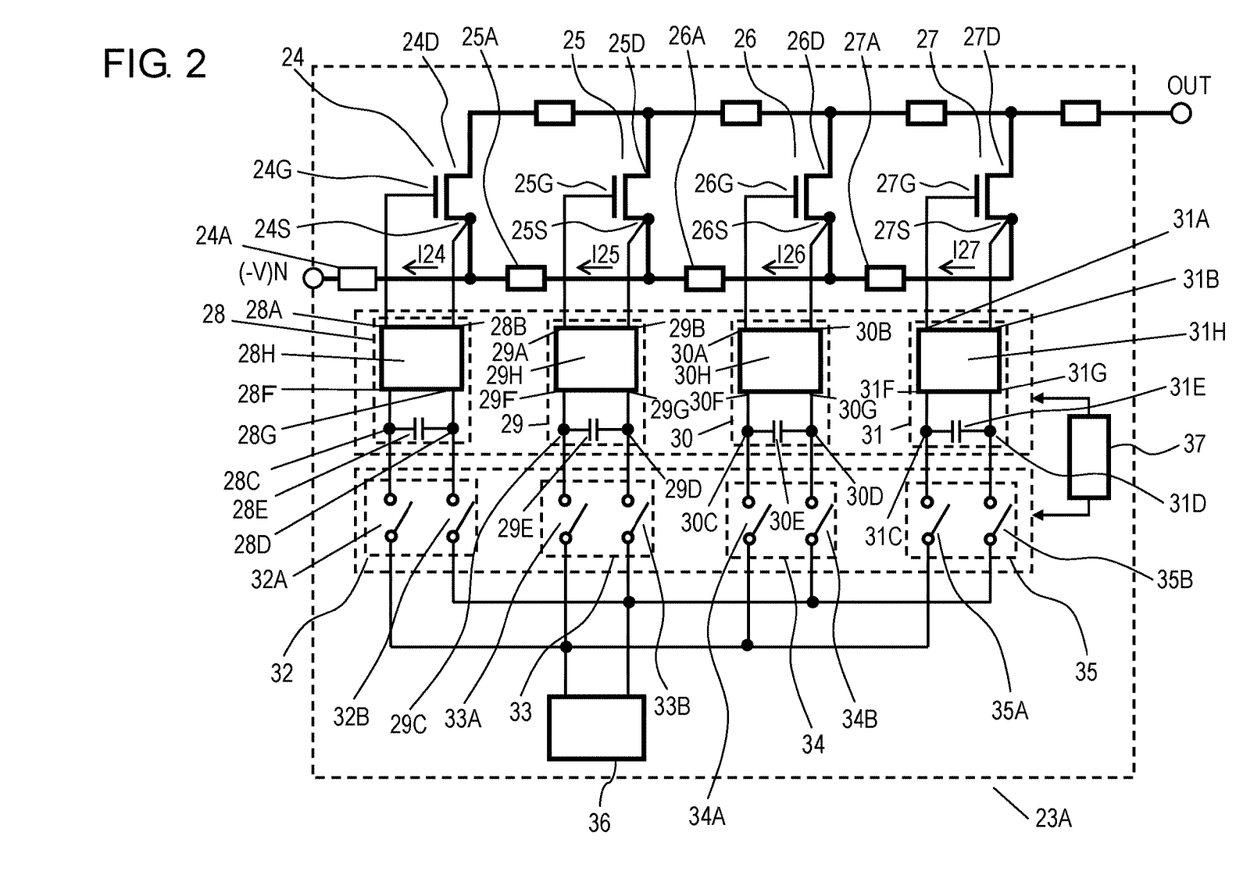
FIG. 2 is a circuit block diagram of the power supply device in accordance with the exemplary embodiment.

FIG. 1 is a circuit block diagram of power supply device 23 using power conversion devices 23A and 23B in accordance with an exemplary embodiment. FIG. 2 is a circuit block diagram of power conversion device 23A in accordance with the exemplary embodiment. Power supply device 23 includes a power conversion device 23A responsible for a negative voltage output, and power conversion device 23B responsible for a positive negative voltage output. Both power conversion device 23A and power conversion device 23B are connected to output terminal "OUT." Basic configurations and operations of power conversion device 23A and power conversion device 23B are the same as each other. However, polarities of the electric power supplied to power conversion device 23A and power conversion device 23B are different from each other, and a part of components constituting power conversion device 23A and power conversion device 23B has reversed polarities. In the following, as an example, power conversion device 23A responsible for a negative voltage output is described.

Power conversion device 23A responsible for a negative voltage output includes switching elements 24, 25, 26, and 27 connected in parallel, gate drive units 28, 29, 30, and 31, switch circuit units 32, 33, 34, and 35, DC power supply unit 36, and control unit 37.

Gate drive unit 28 drives switching element 24. Gate drive unit 29 drives switching element 25. Gate drive unit 30 drives switching element 26. Gate drive unit 31 drives switching element 27. Gate drive units 28, 29, 30, and 31 and switching elements 24, 25, 26, and 27 are provided on one-to-one correspondence with each other. Furthermore, switch circuit unit 32 and gate drive unit 28, switch circuit unit 33 and gate drive unit 29, switch circuit unit 34 and gate drive unit 30, as well as switch circuit unit 35 and gate drive unit 31 are provided on one-to-one correspondence with each other. FIG. 2 shows an example in which four switching elements 24, 25, 26, and 27, four gate drive units 28, 29, 30, and 31, and four switch circuit units 32, 33, 34, and 35 are provided. However, the number thereof may not be limited to four, and is only required to be two or more and to be the same as each other.

DC power supply unit 36 is connected to all of the switch circuit units 32, 33, 34, and 35, and supplies a DC voltage to gate drive units 28, 29, 30, and 31 via switch circuit units 32, 33, 34, and 35.

Switching element 24 includes gate terminal 24G, drain terminal 24D, and source terminal 24S. Switching element 25 includes gate terminal 25G, drain terminal 25D, and source terminal 25S. Switching element 26 includes gate terminal 26G, drain terminal 26D, and source terminal 26S. Switching element 27 includes gate terminal 27G, drain terminal 27D, and source terminal 27S.

Gate drive unit 28 includes driver circuit 28H, first drive input portion 28C, second drive input portion 28D, and capacitor 28E. Driver circuit 28H includes first drive output portion 28A, second drive output portion 28B, first input terminal 28F, and second input terminal 28G. First input terminal 28F is connected to first drive input portion 28C. Second input terminal 28G is connected to second drive input portion 28D.

Gate drive unit 29 includes driver circuit 29H, first drive input portion 29C, second drive input portion 29D, and capacitor 29E. Driver circuit 29H includes first drive output portion 29A, second drive output portion 29B, first input terminal 29F, and second input terminal 29G. First input terminal 29F is connected to first drive input portion 29C. Second input terminal 29G is connected to second drive input portion 29D.

Gate drive unit 30 includes driver circuit 30H, first drive input portion 30C, second drive input portion 30D, and capacitor 30E. Driver circuit 30H includes first drive output portion 30A, second drive output portion 30B, first input terminal 30F, and second input terminal 30G. First input terminal 30F is connected to first drive input portion 30C. Second input terminal 30G is connected to second drive input portion 30D.

Gate drive unit 31 includes driver circuit 31H, first drive input portion 31C, second drive input portion 31D, and capacitor 31E. Driver circuit 31H includes first drive output portion 31A, second drive output portion 31B, first input terminal 31F, and second input terminal 31G. First input terminal 31F is connected to first drive input portion 31C. Second input terminal 31G is connected to second drive input portion 31D.

First drive output portions 28A, 29A, 30A, and 31A are connected to gate terminals 24G, 25G, 26G, and 27G, respectively. Second drive output portions 28B, 29B, 30B, and 31B are connected to source terminals 24S, 25S, 26S, and 27S, respectively.

First drive input portion 28C is connected to one end of capacitor 28E, and second drive input portion 28D is connected to the other end of capacitor 28E. First drive input portion 29C is connected to one end of capacitor 29E, and second drive input portion 29D is connected to the other end of capacitor 29E. First drive input portion 30C is connected to one end of capacitor 30E, and second drive input portion 30D is connected to the other end of capacitor 30E. First drive input portion 31C is connected to one end of capacitor 31E, and second drive input portion 31D is connected to the other end of capacitor 31E.

Switch circuit unit 32 includes first switch 32A and second switch 32B. Switch circuit unit 33 includes first switch 33A and second switch 33B. Switch circuit unit 34 includes first switch 34A and second switch 34B. Switch circuit unit 35 includes first switch 35A and second switch 35B. First switches 32A, 33A, 34A, and 35A are connected to first drive input portions 28C, 29C, 30C, and 31C, respectively. Second switch 32B, 33B, 34B, and 35B are connected to second drive input portions 28D, 29D, 30D, and 31D, respectively.

Control unit 37 controls opening/closing of switch circuit units 32, 33, 34, and 35. Furthermore, in order to turn switching elements 24, 25, 26, and 27 ON or OFF, control unit 37 controls gate drive units 28, 29, 30, and 31 such that gate drive units 28, 29, 30, and 31 alternately output a high-level signal or a low level signal. Control unit 37 performs different controls in two periods, i.e., a normal period and a switching period.

During the normal period, control unit 37 causes switch circuit units 32, 33, 34, and 35 to be closed and to be in a connected state. In other words, control unit 37 controls switch circuit units 32, 33, 34, and 35 such that first switches 32A, 33A, 34A, and 35A and second switch 32B, 33B, 34B, and 35B are closed. In addition, during the normal period, output signals from gate drive units 28, 29, 30, and 31 continue a high level or a low level.

During the switching period, control unit 37 causes switch circuit units 32, 33, 34, and 35 to be opened and to be in a non-connected state. In other words, control unit 37 controls switch circuit units 32, 33, 34, and 35 such that first switches 32A, 33A, 34A, and 35A and second switch 32B, 33B, 34B, and 35B are opened. In addition, during the switching period, the output signals from gate drive units 28, 29, 30, and 31 are switched from a high level to a low level, or a low level to a high level.

From the above-mentioned configurations and operations, a single DC power supply unit 36 supplies a plurality of gate drive units 28, 29, 30, and 31 with electric power. Thus, power conversion device 23A can be reduced in size.

When drive signals output from gate drive units 28, 29, 30, and 31 to switching elements 24, 25, 26, and 27 are switched from the low level to the high level, or from the high level to the low level, gate drive units 28, 29, 30, and 31 are temporarily disconnected or are in a disconnected state from DC power supply unit 36.

When electric currents between a drain and a source of switching elements 24, 25, 26, and 27 are in a transient state, electric potential of source terminals 24S, 25S, 26S, and 27S is easily affected by inductive reactance 24A, 25A, 26A, and 27A, and a change of a voltage between a gate and a source increases easily. In this transient state, gate drive units 28, 29, 30, and 31 are in a state in which they are temporarily disconnected from DC power supply unit 36.

During the period in which gate drive units 28, 29, 30, and 31 are temporarily disconnected from DC power supply unit 36, gate drive units 28, 29, 30, and 31 output a gate drive signal using electric charge stored in capacitors 28E, 29E, 30E, and 31E provided in gate drive units 28, 29, 30, and 31.

Thus, gate drive units 28, 29, 30, and 31 during the period in which they are disconnected from DC power supply unit 36 can supply the voltage between the gate and the source without being affected by the other circuits such as inductive reactance 24A, 25A, 26A, and 27A.

At a timing at which the output signals from gate drive units 28, 29, 30, and 31 are switched from the low level to the high level, or from the high level to the low level, or in a predetermined period before and after the above-mentioned timing, gate drive units 28, 29, 30, and 31 supply an output signal to switching elements 24, 25, 26, and 27 using only electric charge stored in capacitors 28E, 29E, 30E, and 31E.

As a result, during the period in which gate drive units 28, 29, 30, and 31 are disconnected from DC power supply unit 36, power supplies individually provided in gate drive units 28, 29, 30, and 31 supply gate drive units 28, 29, 30, and 31 with electric power. Then, in the above-mentioned period, even when the electric potential in source terminal 24S of switching element 24 is changed, a potential difference between gate terminal 24G and source terminal 24S is not changed. The same is true to switching elements 25, 26, and 27. Therefore, switching elements 24, 25, 26, and 27 driven by gate drive units 28, 29, 30, and 31 can stably operate. As a result, the output from power conversion device 23A becomes stable.

Furthermore, when the output signals generated from gate drive units 28, 29, 30, and 31 continue the high level, or continue the low level, that is, when the output signals are not in a transient state, an output current is approximately constant. Accordingly, electromotive force is not generated in inductive reactance 24A, 25A, 26A, and 27A. Therefore, in a part or whole of the period during which the output signal continues an ON level or, in a part or whole of the period during which the output signal continues an OFF level, even when switch circuit units 32, 33, 34, and 35 are in a connected state, electric potential of source terminals 24S, 25S, 26S, and 27S is stable.

As mentioned above, switching elements 24, 25, 26, and 27 driven by gate drive units 28, 29, 30, and 31 operate stably, and the output from power conversion device 23A becomes stable. Therefore, the output from power supply device 23 is also stable.

Figure 3:
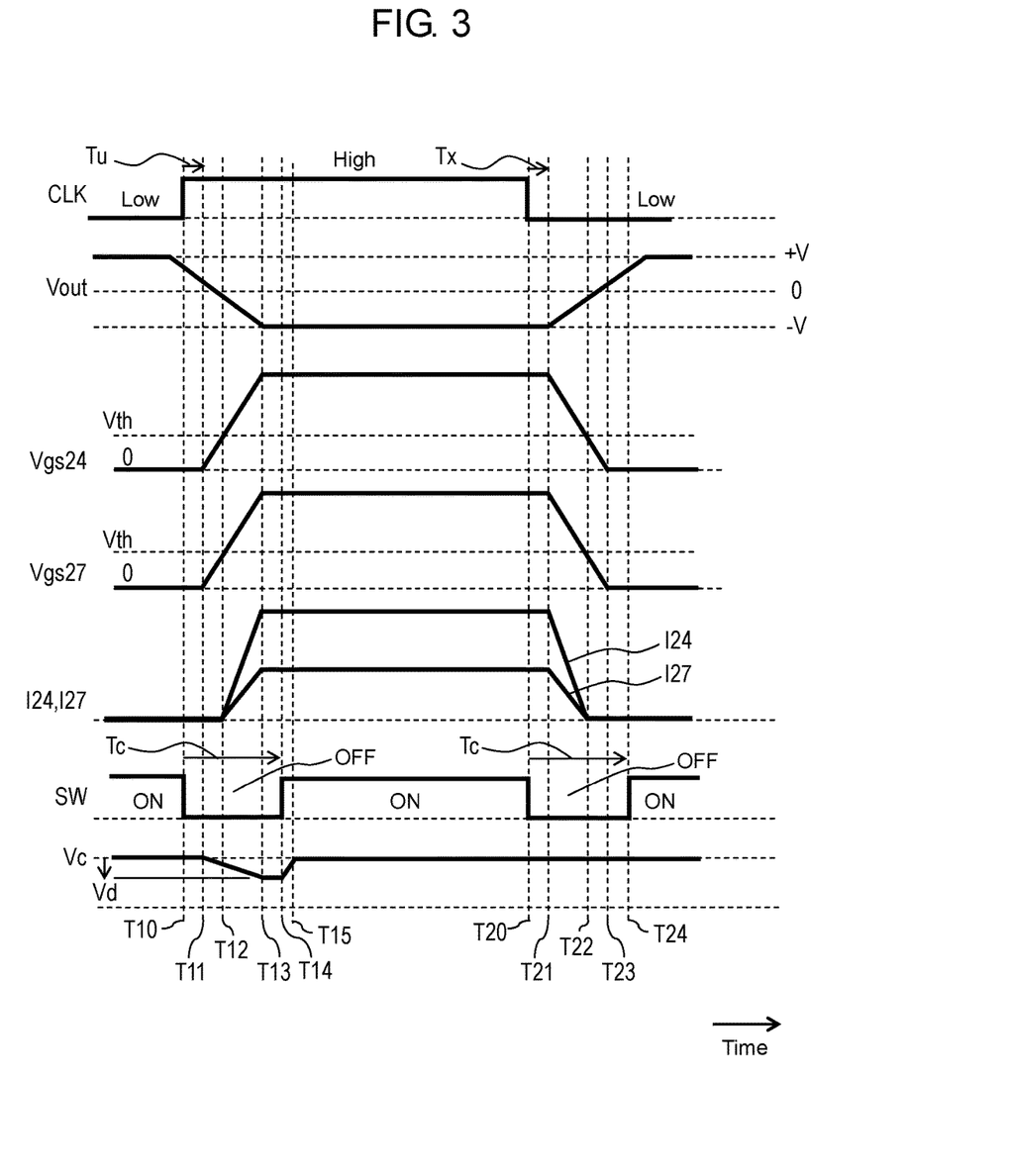
FIG. 3 is a timing chart showing an operation of the power conversion device in accordance with the exemplary embodiment.

Hereinafter, power conversion device 23A is described in detail. FIG. 3 is a timing chart showing operations of power conversion device 23A in accordance with the exemplary embodiment.

In FIG. 3, CLK shows a waveform of a clock pulse. The clock pulse repeats a low level and a high level. Based on this, a timing at which gate drive units 28, 29, 30, and 31 output an output low-level signal or an output high-level signal, and a timing at which switch circuit units 32, 33, 34, and 35 are controlled are determined. That is, the clock pulse is a reference for time of the control in power conversion device 23A.

In FIG. 3, Vout shows a waveform of an output voltage of power supply device 23. In power conversion device 23A and power conversion device 23B, the output voltages repeats +V and −V. As mentioned above, since power conversion device 23A is responsible for a negative voltage output, an output voltage only by power conversion device 23A is different from Vout. Furthermore, a negative DC power supply is connected to input terminal N (see FIGS. 1 and 2) of power conversion device 23A. However, this DC power supply continues to an output of a constant voltage, and therefore is not shown in the timing chart.

In FIG. 3, voltage Vgs24 shows a waveform of a voltage between gate terminal 24G and source terminal 24S in switching element 24, and corresponds to an output signal of gate drive unit 28. Voltage Vgs27 shows a waveform of a voltage between gate terminal 27G and source terminal 27S in switching element 27, and corresponds to an output signal of gate drive unit 31. As shown in FIG. 3, voltage Vgs24 and voltage Vgs27 show the same trajectory.

Not only voltage Vgs24 and voltage Vgs27 but also voltage Vgs25 and voltage Vgs26 show the similar trajectory. Herein, voltage Vgs25 is a voltage between gate terminal 25G and source terminal 25S in switching element 25, and corresponds to an output signal of gate drive unit 29. Voltage Vgs26 is a voltage between gate terminal 26G and source terminal 26S in switching element 26, and corresponds to an output signal of gate drive unit 30.

In FIG. 3, electric current 124 shows an electric current flowing into inductive reactance 24A. Electric current 127 shows an electric current flowing into inductive reactance 27A. In electric current 124 and electric current 127, peak values are different, but the timing of the start and end of electrification and the period during which the peak value continues are the same. Electric current 124 and electric current 127 are shown herein. However, electric currents 125 and 126 flowing into inductive reactance 25A and 26A show the same trajectory and are also different only in the peak values. Furthermore, the peak values of electric currents 124, 125, 126, and 127 are larger in this order. This is because electric currents flowing in each of switching elements 24, 25, 26, and 27 are approximately the same, but electric currents flowing into inductive reactance 24A, 25A, 26A, and 27A are superimposed, respectively.

In FIG. 3, waveform SW shows a timing of opening/closing of switch circuit units 32, 33, 34, and 35. Switch circuit units 32, 33, 34, and 35 are set to repeat ON (connect) and OFF (disconnect), and to shift switch circuit units 32, 33, 34, and 35 from a connected state to a disconnected state when the clock pulse is reversed from a low level to a high level or from a high level to a low level. Furthermore, the disconnected state continues over a predetermined period Tc. The predetermined period Tc corresponds to a period from T10 to T14, and a period from T20 to T24. The predetermined period Tc is a switching control period. Periods other than the predetermined period Tc are a normal control period.

In FIG. 3, Vc shows a potential difference between both ends of capacitor 28E. In other words, Vc shows potential difference between first drive input portion 28C and second drive input portion 28D. Herein, the potential difference between both ends of capacitor 28E is equal to a potential difference between both ends of each of capacitors 29E, 30E, and 31E. That is, the potential difference between first drive input portion 28C and second drive input portion 28D is equal to a potential difference between first drive input portion 29C and second drive input portion 29D, a potential difference between first drive input portion 30C and second drive input portion 30D, and the potential difference between first drive input portion 31C and second drive input portion 31D.

As mentioned above, the timing at which gate drive units 28, 29, 30, and 31 output a high-level or low-level output signal is determined by the clock pulse. Transmission of the clock pulse and the voltage between the gate and the source generated as an output signal from each of gate drive units 28, 29, 30, and 31 are controlled by control unit 37. Control unit 37 controls gate drive units 28, 29, 30, and 31 such that the output signals of gate drive units 28, 29, 30, and 31 are switched from a low level to a high level at T11 that is a predetermined time (Tu) after T10 that is a timing at which the clock pulse is switched from OFF to ON. Thus, a potential difference is generated between the gate and the source of each of switching elements 24, 25, 26, and 27, and switching elements 24, 25, 26, and 27 are being switched from a non-conductive state to a conductive state.

Strictly speaking, timing T11 at which control unit 37 instructs gate drive units 28, 29, 30, and 31 to switch an output signal from the low level to the high level, and timing T12 at which an output signal switches switching elements 24, 25, 26, and 27 from OFF to ON are different from each other. This is because the potential difference between the gate and the source needs to be larger than the predetermined threshold Vth in order to switch switching elements 24, 25, 26, and 27 from the non-conductive state to the conductive state. That is, as shown in slopes of the waveforms of voltage Vgs24 and voltage Vgs27, it takes time for a potential difference between the gate and the source corresponding to the output signal to rise in a process from a low level to a high level. Therefore, switching elements 24, 25, 26, and 27 are switched from a non-conductive state to a conductive state at timing T12 at which voltage Vgs24 and voltage Vgs27 become larger than threshold Vth. Then, an electric current starts to flow between the drain and the source, and electric currents 124 and 127 start to flow into inductive reactance 24A and 27A, respectively. Then, electric currents 124 and 127 gradually increase.

Thereafter, at timing T13 at which voltage Vgs24 and voltage Vgs27 become sufficiently large, a resistance value between the drain and the source of switching elements 24, 25, 26, and 27 becomes minimum. As electric currents 124 and 127 of inductive reactance 24A and 27A, an approximately flat maximum value continues. At this time, Vout as an output voltage of power supply device 23 becomes −V at timing T13. Electric currents 124 and 127 and voltages Vgs24 and Vgs27 continue the respective maximum values until T21. Furthermore, approximately similar to electric currents 124 and 127, Vout shows a trajectory in which the maximum value continues.

Control unit 37 instructs gate drive units 28, 29, 30, and 31 to switch the output signals of gate drive units 28, 29, 30, and 31 from a high level to a low level at T21 that is a predetermined time (Tx) after T20 that is a timing at which the clock pulse is switched from High to Low. Thus, a potential difference existing between the gate and the source of switching elements 24, 25, 26, and 27 until T21 is reduced, and switching elements 24, 25, 26, and 27 are being switched from the conductive state to the non-conductive state.

Strictly speaking, timing T21 at which control unit 37 instructs gate drive units 28, 29, 30, and 31 to switch the output signal from the high level to the low level, and timing T22 at which the output signal switches switching elements 24, 25, 26, and 27 from ON to OFF are different from each other. This is because the potential difference between the gate and the source needs to be smaller than the predetermined threshold Vth in order to switch switching elements 24, 25, 26, and 27 from the conductive state to the non-conductive state. That is, as shown in the slopes of the waveforms of voltage Vgs24 and voltage Vgs27, it takes time for the potential difference between the gate and the source corresponding to the output signal to reduce in a process from a high level to a low level. Therefore, switching elements 24, 25, 26, and 27 are switched from the conductive state to the non-conductive state, and the output signal is switched from the ON level to the OFF level at timing T22 at which voltage Vgs24 and voltage Vgs27 become smaller than threshold Vth. Then, an electric current does not flow between the drain and the source, and electric currents 124 and 127, which have started to gradually reduce, do not flow into inductive reactance 24A, 27A at T22.

Thereafter, at timing T23, voltage Vgs24 and voltage Vgs27 as the potential difference between the gate and the source become 0. A state in which voltage Vgs24 and voltage Vgs27 are 0 continues until T11, which is a timing after the clock pulse is switched from low to high again at next T10. At this time, although not shown in the chart, an output voltage from power conversion device 23A becomes 0V, and shows approximately the same trajectory as that of electric currents 124 and 127.

Output signals of gate drive units 28, 29, 30, and 31 become a high level from T12 to T22, and switching elements 24, 25, 26, and 27 become a conductive state. Then, the output signals of gate drive units 28, 29, 30, and 31 become a low level from T22 to next T12, and switching elements 24, 25, 26, and 27 become a non-conductive state.

Power conversion device 23A includes switch circuit units 32, 33, 34, and 35 between DC power supply unit 36 and gate drive units 28, 29, 30, and 31. Switch circuit units 32, 33, 34, and 35 connect DC power supply unit 36 to gate drive units 28, 29, 30, and 31 in the normal period, and disconnects DC power supply unit 36 from gate drive units 28, 29, 30, and 31 in the switching period.

The normal period corresponds to a period before T10, a period from T14 to T20, and a period after T24 in waveform SW in FIG. 3. The switching period corresponds to a period from T10 to T14, and a period from T20 to T24 in waveform SW.

Switch circuit unit 32 includes first switch 32A connected to high-potential output of DC power supply unit 36, and second switch 32B connected to low-potential output of DC power supply unit 36. Then, first switch 32A is connected to first drive input portion 28C of gate drive unit 28, and second switch 32B is connected to second drive input portion 28D of gate drive unit 28, respectively. First switch 32A and second switch 32B are in synchronization with each other and closed in the normal period and opened in the switching period.

Similarly, switch circuit unit 33 includes first switch 33A connected to a high-potential output of DC power supply unit 36, and second switch 33B connected to a low-potential output of DC power supply unit 36. First switch 33A is connected to first drive input portion 29C of gate drive unit 29, and second switch 33B is connected to second drive input portion 29D of gate drive unit 29. First switch 33A and second switch 33B are in synchronization with each other, and closed in the normal period and opened in the switching period.

Similarly, switch circuit unit 34 includes first switch 34A connected to a high-potential output of DC power supply unit 36, and second switch 34B connected to a low-potential output of DC power supply unit 36. First switch 34A is connected to first drive input portion 30C of gate drive unit 30, and second switch 34B is connected to second drive input portion 30D of gate drive unit 30. First switch 34A and second switch 34B are in synchronization with each other, and closed in the normal period and opened in the switching period.

Similarly, switch circuit unit 35 includes first switch 35A connected to a high-potential output of DC power supply unit 36, and second switch 35B connected to a low-potential output of DC power supply unit 36. First switch 35A is connected to first drive input portion 31C of gate drive unit 31, and second switch 35B is connected to second drive input portion 31D of gate drive unit 31. First switch 35A and second switch 35B are in synchronization with each other, and closed in the normal period and opened in the switching period.

Switch circuit units 32, 33, 34, and 35 and gate drive units 28, 29, 30, and 31 are controlled by control unit 37. Then, control unit 37 performs control such that first switches 32A, 33A, 34A, and 35A and second switches 32B, 33B, 34B, and 35B are synchronized.

Capacitor 28E is provided between first drive input portion 28C and second drive input portion 28D in gate drive unit 28. Capacitor 29E is provided between first drive input portion 29C and second drive input portion 29D in gate drive unit 29. Capacitor 30E is provided between first drive input portion 30C and second drive input portion 30D in gate drive unit 30. Capacitor 31E is provided between first drive input portion 31C and second drive input portion 31D of gate drive unit 31. Thus, in the normal period, capacitors 28E, 29E, 30E, and 31E are charged by DC power supply unit 36; and in the switching period, capacitors 28E, 29E, 30E, and 31E are in a dischargeable state. In particular, in the timing from T11 to T13 after the clock pulse has been switched from OFF to ON, capacitors 28E, 29E, 30E, and 31E are discharged so that gate drive units 28, 29, 30, and 31 can generate an output signal.

As mentioned above, during the switching period, switch circuit units 32, 33, 34, and 35 disconnect DC power supply unit 36 from gate drive units 28, 29, 30, and 31. Therefore, during the switching period, gate drive units 28, 29, 30, and 31 are supplied with a voltage between a gate and a source not by electric power from DC power supply unit 36 but by electric charge that has been discharged from capacitors 28E, 29E, 30E, and 31E. That is to say, with an electric charge discharged from the capacitor, a voltage is supplied between first drive output portion 28A and second drive output portion 28B, between first drive output portion 29A and second drive output portion 29B, between first drive output portion 30A and second drive output portion 30B, as well as between first drive output portion 31A and second drive output portion 31B. Thus, during the switching period, gate drive units 28, 29, 30, and 31 have individual power supplies, and gate drive units 28, 29, 30, and 31 output a voltage between the gate and the source by the power supplies.

Herein, it is desirable that capacitors 28E, 29E, 30E, and 31E have the same capacity. Furthermore, it is desirable that the circuit constants of gate drive units 28, 29, 30, and 31 have the same values. Thus, voltages output from all the gate drive units 28, 29, 30, and 31 are the same as each other. Further, the voltages between the gate and the source in switching elements 24, 25, 26, and 27 are also the same as each other. The above-mentioned capacity and the circuit constant may have different values as long as capacitors 28E, 29E, 30E, and 31E have sufficient electric charge for supplying the voltage between the gate and the source to switching elements 24, 25, 26, and 27.

Use of switching elements 24, 25, 26, and 27 having the same characteristics allows operations of all switching elements 24, 25, 26, and 27 to be completely linked to each other. Then, power conversion device 23A stably operates, and the output from power conversion device 23A becomes stable.

At this time, the voltages between the gate and the source in switching elements 24, 25, 26, and 27 are not affected by electric currents 124, 125, 126, and 127 having different values. In other words, by inductive reactance 24A, 25A, 26A, and 27A and electric currents 124, 125, 126, and 127, different voltages in a transient state exist mainly in a period from T12 to T13 and periods before and after the period from T12 to T13. However, they are not applied to source terminals 24S, 25S, 26S, and 27S, and not involved in the potential difference between the gate and the source. Further, as mentioned above, during the switching period, gate drive units 28, 29, 30, and 31 are in a state of having individual power supplies. As a result, a stable voltage between the gate and the source having appropriate potential difference is output, respectively, from first drive output portion 28A and second drive output portion 28B, from first drive output portion 29A and second drive output portion 29B, from first drive output portion 30A and second drive output portion 30B, as well as from first drive output portion 31A and second drive output portion 31B.

Furthermore, the normal period such as a period from T14 to T20, or a period before T10 or a period after T24 does not include a transient state by inductive reactance 24A, 25A, 26A, and 27A and electric currents 124, 125, 126, and 127. Therefore, even when DC power supply unit 36 is commonly applied to gate drive units 28, 29, 30, and 31, electric potential of source terminals 24S, 25S, 26S and 27S, and the voltage between the gate and the source are stable. Then, operations of all switching elements 24, 25, 26, and 27 also become stable. As a result, power conversion device 23A stably operates, and output of power conversion device 23A becomes stable.

As mentioned above, switch circuit units 32, 33, 34, and 35 disconnect DC power supply unit 36 and gate drive units 28, 29, 30, and 31 at T10 that is a predetermined period before timing T11 that is a timing at which the clock pulse is switched from Low to High. Then, switch circuit units 32, 33, 34, and 35 connect DC power supply unit 36 to gate drive units 28, 29, 30, and 31 again at T14 that is a predetermined period after period T13 that is a timing at which voltages Vgs24 and Vgs27 or electric currents 124 and 127 become the maximum value.

Furthermore, switch circuit units 32, 33, 34, and 35 disconnect DC power supply unit 36 and gate drive units 28, 29, 30, and 31 at T20 that is a predetermined period before timing T21 that is a timing at which the clock pulse is switched from High to Low. Then, switch circuit units 32, 33, 34, and 35 connect DC power supply unit 36 to gate drive units 28, 29, 30, and 31 again at T24 that is a predetermined period after the period T23 that is a timing at which voltages Vgs24 and Vgs27 become a minimum value.

In this way, during the switching period, gate drive units 28, 29, 30, and 31 are in a state of having individual power supplies, resulting in supplying switching elements 24, 25, 26, and 27 with a stable voltage between the gate and the source.

Although not shown in the timing chart of voltage Vgs24 and voltage Vgs27 in FIG. 3, at T10 or T20 at which switch circuit units 32, 33, 34, and 35 are shifted from the normal period to the switching period, voltage Vgs24 and voltage Vgs27 may be changed. Therefore, it is desirable to set capacity values of capacitors 28E, 29E, 30E, and 31E such that change values of voltage Vgs24 and voltage Vgs27 be smaller than Vth. Thus, in a period from T10 to T11 or a period from T20 to T21, electrification of switching elements 24, 25, 26, and 27 is suppressed. Thus, power conversion device 23A stably operates, and an output of power conversion device 23A becomes stable.

Furthermore, in FIG. 3, there are time differences between T10 and T11, between T13 and T14, between T20 and T21, and between T23 and T24, respectively. However, each of T10 and T11, T13 and T14, T20 and T21, and T23 and T24 may be the same timing.

Furthermore, in accordance with the exemplary embodiment, in the switching period, a period from T12 to T13, and a period from T21 to T22 in which a transient state occurs, power conversion device 23A operates stably, and output a stable output voltage. However, capacitors 28E, 29E, 30E, and 31E preferably start discharging at timing T11 before the transient state occurs. Accordingly, an actual switching period needs to be at least from T11 to T13. Therefore, it is desirable that the switching period starts before timing T11 that is before output signals of gate drive units 28, 29, 30, and 31 become a high level. During the switching period from T21 to T22, it is not necessary to consider discharging.

Furthermore, during a period from T11 to T13 in FIG. 3, capacitors 28E, 29E, 30E, and 31E discharge electric charge to switching elements 24, 25, 26, and 27. Therefore, in the period from T11 to T13, a voltage at both ends of each of capacitors 28E, 29E, 30E, and 31E drops by a voltage value equivalent to potential difference Vd. Therefore, in order to allow capacitors 28E, 29E, 30E, and 31E to appropriately operate and discharge, the capacities of capacitors 28E, 29E, 30E, and 31E need to be a value capable of supplying a control voltage that switches switching elements 24, 25, 26, and 27 from a non-conductive state to a conductive state. In other words, the power capacity of capacitors 28E, 29E, 30E, and 31E may be a value larger than an electric power for controlling switching elements 24, 25, 26, and 27.

In a period from T14 to T15 in FIG. 3, capacitors 28E, 29E, 30E, and 31E after discharging is charged again. A period required for charging is shorter than a period required for discharging. In addition, a period required for charging is shorter than a period corresponding to the normal period from T14 to T15 in which switch circuit units 32, 33, 34, and 35 are closed. A cycle of the clock pulse, and periods of the normal period and the switching period determined depending on the cycle are determined in advance. Therefore, it is preferable that capacities of capacitors 28E, 29E, 30E, and 31E are determined such that charging is completed for a period shorter than the above-mentioned each period.

In the above description, control unit 37 is disposed separately from gate drive units 28, 29, 30, and 31, and switch circuit units 32, 33, 34, and 35. However, control unit 37 may be included in gate drive units 28, 29, 30, and 31. Alternatively, control unit 37 may be included in switch circuit units 32, 33, 34, and 35. Control unit 37 may be disposed in any sections of power conversion device 23A. Control unit 37 is only required to have a function of controlling both gate drive units 28, 29, 30, and 31 and switch circuit units 32, 33, 34, and 35.

Furthermore, the above description shows an example in which switching elements 24, 25, 26, and 27 are an N-channel type field effect transistor (FET). However, a P-channel type FET may be used as switching elements 24, 25, 26, and 27. In the case of the N-channel type, in order to turn switching elements 24, 25, 26, and 27 ON, control unit 37 may control gate drive units 28, 29, 30, and 31 such that gate drive units 28, 29, 30, and 31 output a high-level signal. In the case of the P-channel type, in order to turn switching elements 24, 25, 26, and 27 ON, control unit 37 preferably controls gate drive units 28, 29, 30, and 31 such that gate drive units 28, 29, 30, and 31 output a low-level signal. Further, in the case of the N-channel type, in order to turn switching elements 24, 25, 26, and 27 OFF, control unit 37 preferably controls gate drive units 28, 29, 30, and 31 such that gate drive units 28, 29, 30, and 31 output a low-level signal. In the case of the P-channel type, in order to turn switching elements 24, 25, 26, and 27 OFF, control unit 37 preferably controls gate drive units 28, 29, 30, and 31 such that gate drive units 28, 29, 30, and 31 output a high-level signal.

According to the present disclosure, a plurality of gate drive units can be supplied with electric power using a single DC power supply unit. Thus, a power conversion device can be reduced in size.

When a gate drive signal is switched from a low level to a high level, or from a high level to a low level, a gate drive unit is temporarily disconnected from the DC power supply unit. In other words, when an electric current between a drain and a source of a switching element is in a transient state, and the electric potential of a source terminal is easily affected by the inductive reactance, the gate drive unit is temporarily disconnected from the DC power supply unit.

In a period in which the gate drive unit is temporarily disconnected from the DC power supply unit, the gate drive unit transmits a gate drive signal using electric charge stored in the capacitor. Thus, the individual gate drive units in the period in which the gate drive unit is temporarily disconnected from DC power supply unit can supply a voltage, which is not affected by the other circuit elements or the like, to a switching elements. In other words, a voltage between a gate and a source driven by a gate drive unit of the switching element is stable, and output from the power conversion device is stable.

INDUSTRIAL APPLICABILITY

A power conversion device of the present disclosure has a small size and has an advantageous effect of stabilizing an output, and is useful for various apparatuses.

REFERENCE MARKS IN THE DRAWINGS 1, 12, 23 power supply device
2, 3, 13, 23A, 23B power conversion device
4, 5, 6, 7, 15, 16, 17, 18 switch unit
24, 25, 26, 27 switching element
4A, 5A, 6A, 7A, 15A, 16A, 17A, 18A, 24A, 25A, 26A, 27A inductive reactance
8, 9, 10, 11, 19, 20, 21, 22 gate drive unit
8P, 9P, 10P, 11P, 14 DC power supply
24D, 25D, 26D, 27D drain terminal
15G, 16G, 17G, 18G, 24G, 25G, 26G, 27G gate terminal
4S, 5S, 6S, 7S, 15S, 16S, 17S, 18S, 24S, 25S, 26S, 27S source terminal
28, 29, 30, 31 gate drive unit
28A, 29A, 30A, 31A first drive output portion
28B, 29B, 30B, 31B second drive output portion
28C, 29C, 30C, 31C first drive input portion
28D, 29D, 30D, 31D second drive input portion
28E, 29E, 30E, 31E capacitor
28F, 29F, 30F, 31F first input terminal
28G, 29G, 30G, 31G second input terminal
28H, 29H, 30H, 31H driver circuit
32, 33, 34, 35 switch circuit unit
32A, 33A, 34A, 35A first switch
32B, 33B, 34B, 35B second switch
36 DC power supply unit
37 control unit
14, 15, 16, 17, 115, 116, 117, 118, 124, 125, 126, 127 electric current

The invention claimed is:
1. A power conversion device comprising:
a switching element including a gate terminal, a drain terminal, and a source terminal, the switching element being one of a plurality of switching elements connected in parallel;
a gate drive unit including:
 a driver circuit including
  a first drive output portion connected to the gate terminal;
  a second drive output portion connected to the source terminal;
  a first input terminal; and
  a second input terminal;
 a first drive input portion connected to the first input terminal;
 a second drive input portion connected to the second input terminal; and
 a capacitor installed between the first drive input portion and the second drive input portion,
 the gate drive unit being provided corresponding to the switching element, and being one of a plurality of gate drive units,
a switch circuit unit including:
 a first switch connected to the first drive input portion; and a second switch connected to the second drive input portion, the switch circuit unit being provided corresponding to the gate drive unit, and being one of a plurality of switch circuit units, a DC power supply unit connected to the plurality of switch circuit units; and a control unit connected to the plurality of switch circuit units and controlling opening and closing of the plurality of switch circuit units, and connected to the plurality of gate drive units and controlling the plurality of gate drive units such that the switching elements are turned ON or OFF, wherein during a normal period, the control unit causes the first switch and the second switch to be closed, and causes a signal from the gate drive unit to continue a high level or a low level; and during a switching period, the control unit causes the first switch and the second switch to be opened, and switches the signal from the gate drive unit from a low level to a high level or from a high level to a low level.

2. The power conversion device of claim 1, wherein in the switching period, a predetermined time before the signal from the gate drive unit is switched from a low level to a high level, the control unit causes the first switch and the second switch to be opened.

3. The power conversion device of claim 2, wherein a predetermined time after a voltage between the gate terminal and the source terminal of the switching element becomes a maximum value, the control unit causes the first switch and the second switch to be closed.

4. The power conversion device of claim 1, wherein in the switching period, a predetermined time before the signal from the gate drive unit is switched from a high level to a low level, the control unit causes the first switch and the second switch to be opened.

5. The power conversion device of claim 4, wherein a predetermined time after a voltage between the gate terminal and the source terminal of the switching element becomes a minimum value, the control unit causes the first switch and the second switch to be closed.

6. The power conversion device of claim 1, wherein during the switching period, the gate drive unit outputs the signal using electric charge stored in the capacitor.

7. A power supply device comprising two of the power conversion devices of claim 1, wherein polarities of electric power supplied to the two power conversion devices are different from each other.

* * * * *